(12) United States Patent
Lin et al.

(10) Patent No.: US 10,510,907 B2
(45) Date of Patent: Dec. 17, 2019

(54) SOLAR PANEL

(71) Applicant: SUNPOWER CORPORATION, San Jose, CA (US)

(72) Inventors: Yafu Lin, San Jose, CA (US); Benjamin Francois, San Jose, CA (US)

(73) Assignee: SUNPOWER CORPORATION, San Jose, CA (US)

(*) Notice: Subject to any disclaimer, the term of this patent is extended or adjusted under 35 U.S.C. 154(b) by 260 days.

(21) Appl. No.: 15/441,117

(22) Filed: Feb. 23, 2017

(65) Prior Publication Data
US 2017/0243986 A1    Aug. 24, 2017

Related U.S. Application Data

(60) Provisional application No. 62/299,287, filed on Feb. 24, 2016.

(51) Int. Cl.
| | | |
|---|---|---|
| *H01L 31/02* | (2006.01) | |
| *H01L 31/028* | (2006.01) | |
| *H01L 31/18* | (2006.01) | |
| *H01L 31/0224* | (2006.01) | |
| *H01L 31/042* | (2014.01) | |
| *H01L 31/05* | (2014.01) | |

(52) U.S. Cl.
CPC ........ *H01L 31/0201* (2013.01); *H01L 31/028* (2013.01); *H01L 31/022433* (2013.01); *H01L 31/042* (2013.01); *H01L 31/0504* (2013.01); *H01L 31/1804* (2013.01); *H01L 31/188* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 2010/0243024 A1* | 9/2010 | Hashimoto | ......... | H01L 31/0201 136/244 |
| 2011/0014725 A1* | 1/2011 | Abiko | ............... | H01L 31/048 438/4 |
| 2012/0305048 A1* | 12/2012 | Tsuruoka | ........ | H01L 31/022433 136/244 |
| 2015/0287851 A1* | 10/2015 | Endo | ................ | H01L 31/02243 136/244 |
| 2017/0301801 A1* | 10/2017 | Nguyen | .......... | H01L 31/022433 |

* cited by examiner

*Primary Examiner* — Jayne L Mershon
(74) *Attorney, Agent, or Firm* — Innovation Counsel LLP

(57) ABSTRACT

A high efficiency configuration for a solar cell module comprises solar cells arranged in an overlapping shingled manner and conductively bonded to each other in their overlapping regions to form super cells, which may be arranged to efficiently use the area of the solar module.

17 Claims, 10 Drawing Sheets

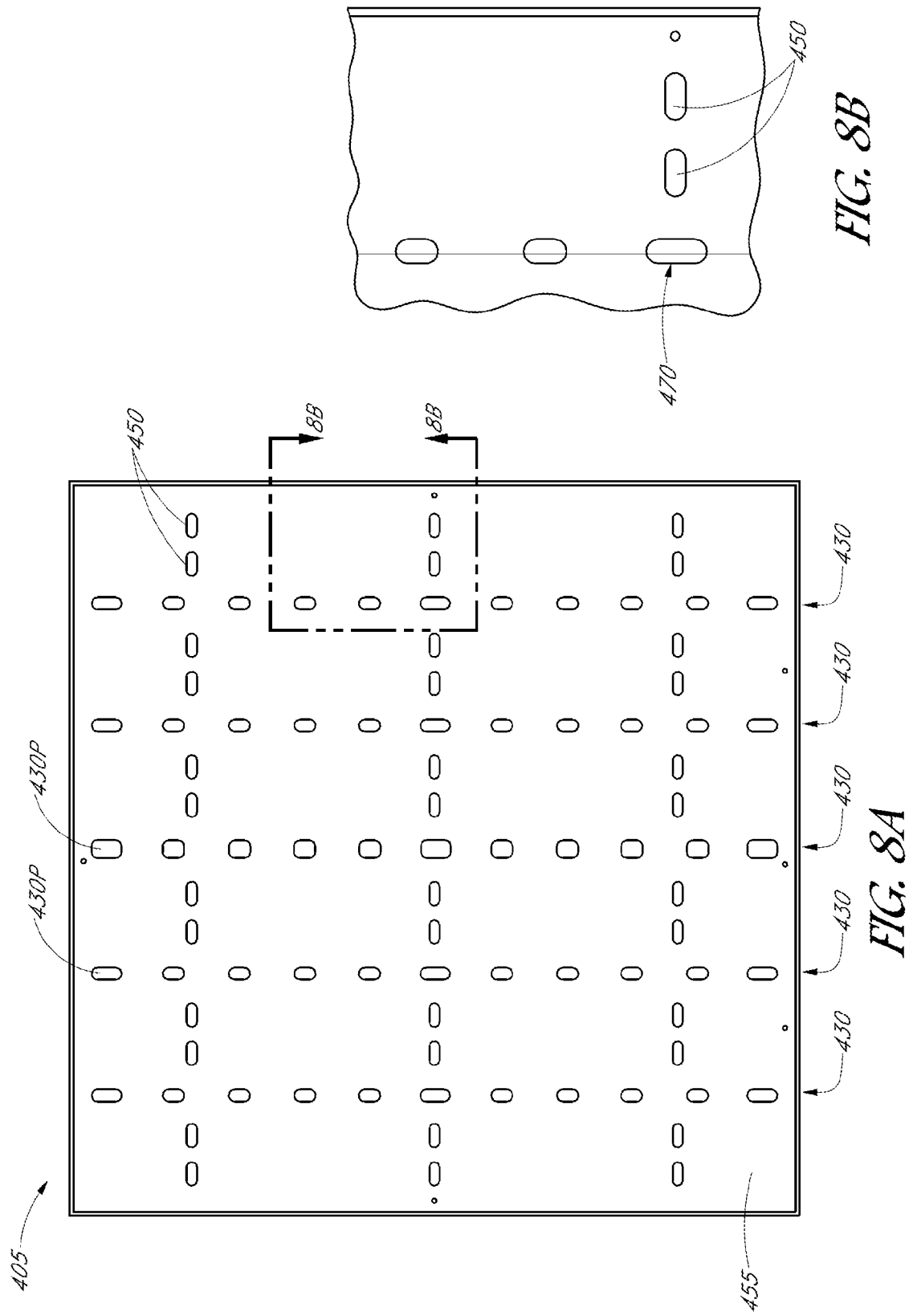

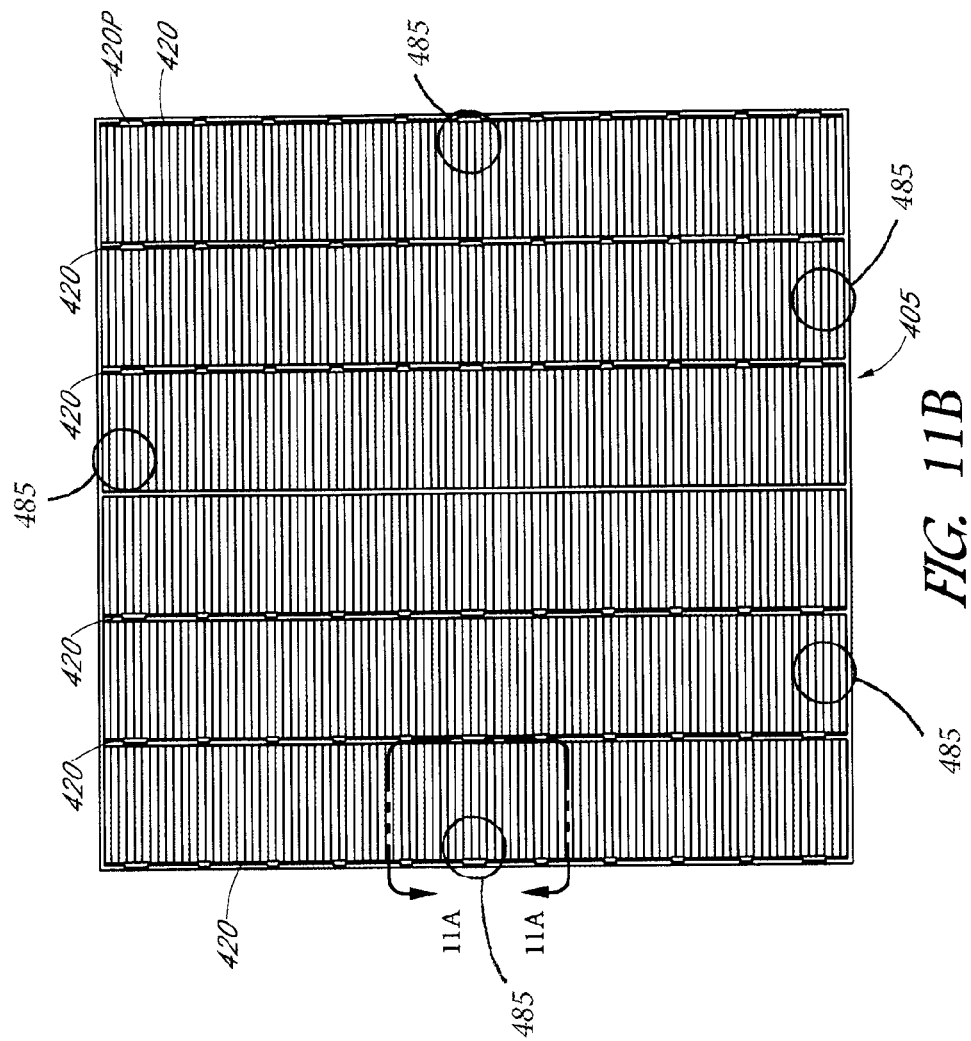
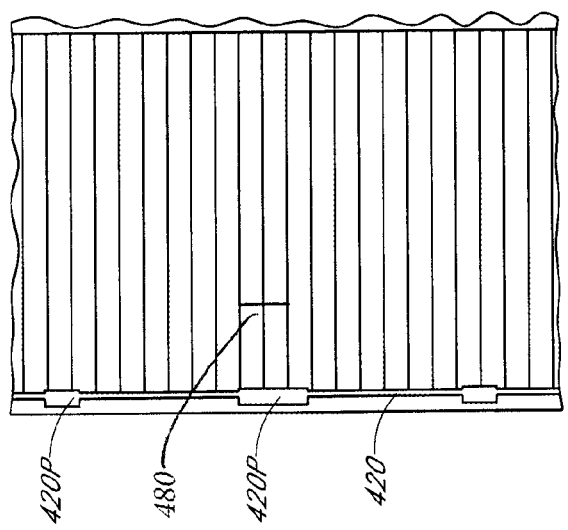

SOLAR PANEL

CROSS REFERENCE TO RELATED APPLICATIONS

This application claims benefit of priority to U.S. Provisional Patent Application 62/299,287 titled "Solar Panel" and filed Feb. 24, 2016, which is incorporated herein by reference in its entirety.

FIELD OF THE INVENTION

The invention relates generally to solar cell modules in which the solar cells are arranged in a shingled manner.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

SUMMARY

In a first aspect, a solar cell comprises a silicon semiconductor diode structure having a front surface to be illuminated by light and a back surface, a front surface metallization pattern comprising a plurality of straight front surface bus bars each having a long axis, and a rear surface metallization pattern comprising a plurality of straight rear surface bus bars each having a long axis. The front surface bus bars are arranged side-by-side with their long axes parallel and spaced apart from each other in a direction perpendicular to their long axes. The rear surface bus bars are arranged side-by-side with their long axes parallel and spaced apart from each other in a direction perpendicular to their long axes. The long axes of the rear surface bus bars are oriented parallel to the long axes of the front surface bus bars, and each front surface bus bar partially overlies a corresponding rear surface bus bar to overlap the corresponding rear surface bus bar in a direction perpendicular to the long axes of the front and rear surface bus bars.

The front and rear surfaces of the solar cell may be square or pseudo-square in shape, for example. The long axes of the front and rear surface bus bars may be oriented parallel to an edge of the solar cell, and may extend for substantially the full length of the edge of the solar cell.

The solar cell may comprise one or more additional front surface bus bars each having a long axis oriented parallel to the long axes of the plurality of front surface bus bars, arranged side-by-side with the plurality of front surface bus bars and spaced apart from each other and from the plurality of front surface bus bars in a direction perpendicular to their long axes, and not overlying any rear surface bus bar.

The solar cell may comprise one or more additional rear surface bus bars each having a long axis oriented parallel to the long axes of the plurality of rear surface bus bars, arranged side-by-side with the plurality of rear surface bus bars and spaced apart from each other and from the plurality of rear surface bus bars in a direction perpendicular to their long axes, and not underlying any front surface bus bar.

In a second aspect, a method of manufacturing a silicon solar cell comprises providing a silicon semiconductor diode structure having a front surface to be illuminated by light and a back surface, depositing on the front surface a front surface metallization pattern comprising a plurality of straight front surface bus bars each having a long axis, and depositing on the rear surface a rear surface metallization pattern comprising a plurality of straight rear surface bus bars each having a long axis. The front surface bus bars are arranged side-by-side with their long axes parallel and spaced apart from each other in a direction perpendicular to their long axes. The rear surface bus bars are arranged side-by-side with their long axes parallel and spaced apart from each other in a direction perpendicular to their long axes. The long axes of the rear surface bus bars are oriented parallel to the long axes of the front surface bus bars, and each front surface bus bar partially overlies a corresponding rear surface bus bar to overlap the corresponding rear surface bus bar in a direction perpendicular to the long axes of the front and rear surface bus bars.

The method may comprise depositing on the front surface one or more additional front surface bus bars each having a long axis oriented parallel to the long axes of the plurality of front surface bus bars, arranged side-by-side with the plurality of front surface bus bars and spaced apart from each other and from the plurality of front surface bus bars in a direction perpendicular to their long axes, and not overlying any rear surface bus bar.

The method may comprise depositing on the rear surface one or more additional rear surface bus bars each having a long axis oriented parallel to the long axes of the plurality of rear surface bus bars, arranged side-by-side with the plurality of rear surface bus bars and spaced apart from each other and from the plurality of rear surface bus bars in a direction perpendicular to their long axes, and not underlying any front surface bus bar.

In a third aspect, a method of making a shingled string of solar cells comprises obtaining a solar cell as described in the first aspect above and/or as manufactured by the second aspect above, identifying the location of each of the front surface bus bars with a camera, and cutting a plurality of scribe lines in the solar cell on the rear of the solar cell. Each scribe line is cut parallel to and through a corresponding rear surface bus bar into the silicon semiconductor structure at a location referenced to the location determined with the camera of the front surface bus bar partially overlying the rear surface bus bar, with the scribe line spaced apart from an edge of the front surface bus bar by a predetermined distance.

The method may further comprise separating the solar cell along the scribe lines to form a plurality of smaller solar cells each of which comprises a front surface bus bar on its front surface positioned along a first edge of the smaller solar cell and a rear surface bus bar on its rear surface positioned along a second edge of the smaller solar cell opposite from its first edge, and arranging the plurality of smaller solar cells in line with front and rear surface bus bars of adjacent smaller solar cells overlapping in a shingled manner and conductively bonded to each other to electrically and mechanically connect the smaller solar cells in series.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIGS. 8A-8B show an example rear surface metallization pattern for a standard size silicon solar cell suitable for use with the front surface metallization pattern of FIGS. 7A-7B in the method of FIGS. 4A-4C.

FIG. 11A and FIG. 11B show another example front surface metallization pattern for a standard size silicon solar cell suitable for use in the method of FIGS. 4A-4C. In this example the metallization pattern comprises fiducials.

DETAILED DESCRIPTION

Figure 1:
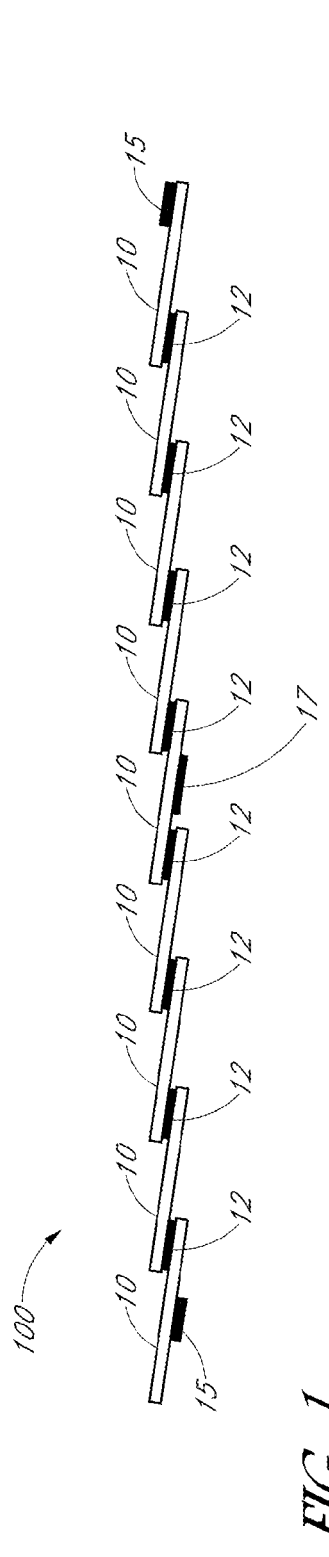
FIG. 1 shows a cross-sectional diagram of a string of series-connected solar cells arranged in a shingled manner with the ends of adjacent solar cells overlapping to form a shingled super cell.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners. The term "identical" is intended to mean "identical or substantially identical" and to encompass minor deviations in shape, dimensions, structure, composition, or configuration, for example.

This specification discloses high-efficiency solar modules (also referred to herein as solar panels) comprising silicon solar cells arranged in an overlapping shingled manner and electrically connected in series by conductive bonds between adjacent overlapping solar cells to form super cells, with the super cells arranged in physically parallel rows in the solar module. A super cell may comprise any suitable number of solar cells. The super cells may have lengths spanning essentially the full length or width of the solar module, for example, or two or more super cells may be arranged end-to-end in a row. This arrangement hides solar cell-to-solar cell electrical interconnections and increases the efficiency and the aesthetic attractiveness of the module.

As explained in more detail below, this specification further discloses front and rear surface metallization patterns for standard size silicon solar cell wafers that are to be separated into smaller (e.g., rectangular strip) solar cells for use in forming shingled arrangements of solar cells (super cells) as described above. These front and rear surface metallization patterns allow the standard size solar cells to be separated into smaller cells by a method resulting in greater precision in the location of edges of the smaller solar cells with respect to front and rear surface metallization features (e.g., bus bars). This method is also elaborated on below. The improved precision in the location of front and rear surface metallization features on the separated solar cells reduces the amount of overlap between adjacent solar cells in a super cell required to form a good electrical connection between the solar cells.

Turning now to the figures for a more detailed understanding of the solar cells, solar modules, and methods described in this specification, FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load.

In the examples described in this specification, each solar cell 10 is a rectangular crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sun side) surface metallization pattern may be disposed on a semiconductor layer of p-type conductivity, and the rear (shaded side) surface metallization pattern disposed on a semiconductor layer of n-type conductivity.

Rectangular solar cells 10 may be prepared, for example, by separating a standard size square or pseudo-square solar cell wafer into two or more (i.e., N) rectangular solar cells each having a length equal to the side length (e.g., 156 millimeters) of the standard sized solar cell wafer and a width equal to a fraction (i.e., about 1/N) of the side length of the standard sized solar cell wafer. N may be, for example, 2 to 20 or more, for example 6 or 8.

Solar cells 10 may also be prepared, for example, by separating a standard size square or pseudo-square solar cell wafer along a first set of N−1 (e.g., cleave) lines parallel to one side of the wafer and along a second set of P−1 lines oriented perpendicular to the first set of lines to form N×P solar cells having widths of about 1/N of the side length of the standard size wafer and lengths of about 1/P of the side length of the standard size wafer. For example, for N=6 and P=2 a standard size wafer having side lengths of 156 millimeters would provide 12 rectangular solar cells 10 each having a width of about 26 millimeters and a length of about 78 millimeters.

Referring again to FIG. 1, in super cell 100 adjacent solar cells 10 are conductively bonded to each other in the region in which they overlap by an electrically conductive bonding material 12 that electrically connects the front surface metallization pattern of one cell to the rear surface metallization pattern of the adjacent cell. Suitable electrically conductive bonding materials may include, for example, electrically conductive adhesives and electrically conductive adhesive films and adhesive tapes, and conventional solders.

A terminal lead 15 (e.g., a metal ribbon) is conductively bonded to a solar cell 10 at one end of super cell 100 to provide an electrical output of one polarity (either positive or negative) from the super cell, and another terminal lead 15 is conductively bonded to the solar cell 10 at the other end of the super cell to provide a second electrical output from the super cell of the opposite polarity. In the illustrated example one terminal lead is bonded to the rear surface metallization its solar cell and the other terminal lead is bonded to the front surface metallization of its solar cell, and all solar cells in the super cell contribute power to its output. In an alternative variation, not shown, both terminal leads are bonded to the rear surface metallization of their solar cells, and one of the end solar cells does not contribute power to the output of the super cell. The latter variation may simplify lay-up of a solar module during the manufacturing process.

Still referring to FIG. 1, one or more additional conductive leads (e.g., metal ribbons) 17 may each be conductively bonded to the rear surface metallization of a corresponding solar cell located at an intermediate position between the ends of the super cell. Leads 17 may be used, for example, to create bypass diode circuits around segments of the super cell.

Figure 2:
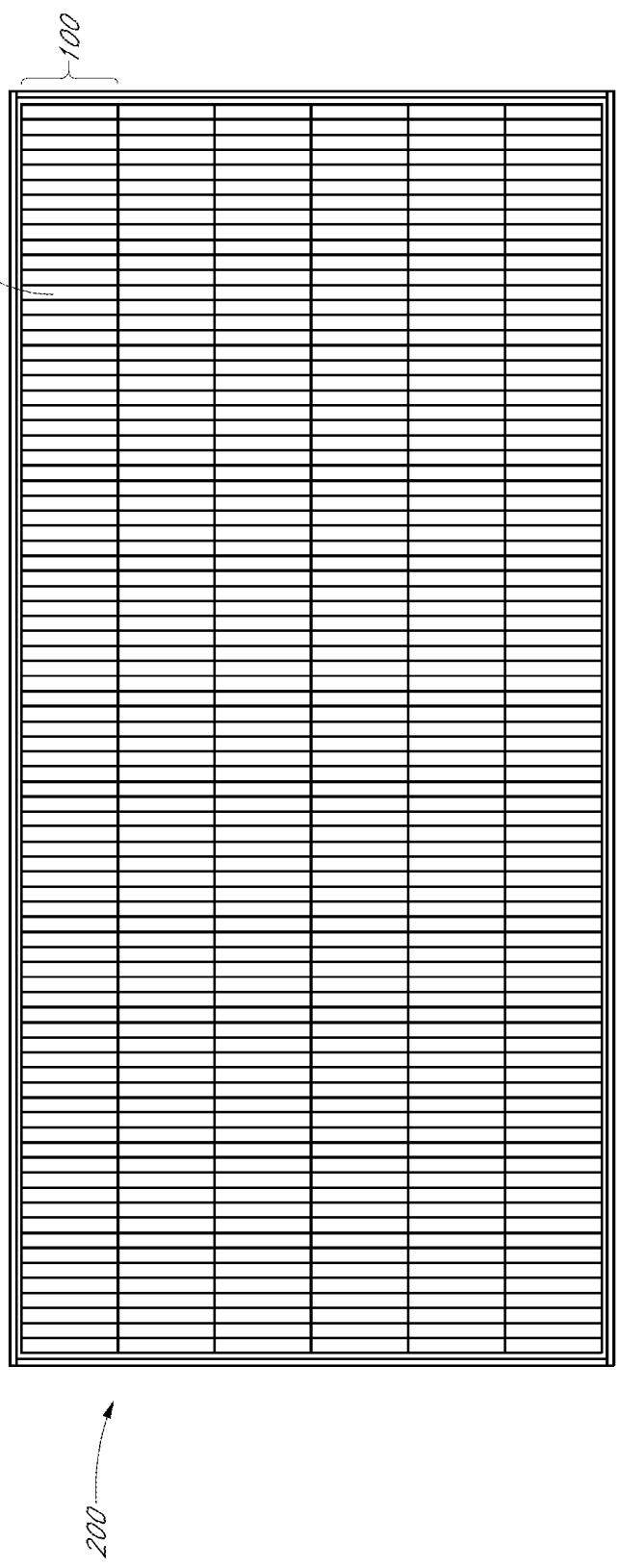
FIG. 2 shows a diagram of the front surface of an example rectangular solar module comprising a plurality of rectangular shingled super cells, with the long side of each super cell having a length of approximately the full length of the long side of the module. The super cells are arranged with their long sides parallel to the long sides of the module.

FIG. 2 shows a front view of an example rectangular solar module 200 comprising six rectangular super cells 100, each of which has a length approximately equal to the length of the long sides of the solar module. In this example the super cells are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells, which may be electrically interconnected in series for example. The modules may have short sides having a length, for example, of about 1 meter and long sides having a length, for example, of about 1.5 to about 2.0 meters. Any other suitable shapes (e.g., square) and dimensions for the solar modules may also be used. A super cell may comprise any suitable number of rectangular solar cells of any suitable dimensions. Similarly, a row of super cells may comprise any suitable number of rectangular solar cells of any suitable dimensions arranged in one or more super cells.

Solar modules as described herein typically comprise many more (e.g., N times) as many solar cells as a conventional module of the same size because N rectangular solar cells are formed from a single conventional sized solar cell wafer. Optionally, the super cells formed from these solar cells may be arranged in an electrically parallel/series combination that provides current and voltage outputs similar to those provided by a solar module of about the same size comprising series-connected conventional size solar cells. For example, if a conventional module includes M conventional size solar cells electrically connected in series, then a corresponding shingled super cell module comprising N electrically parallel rows of super cells with each super cell row comprising M series connected rectangular solar cells (each having 1/N the area of a conventional solar cell) would provide about the same voltage and current output as the conventional module.

Any other suitable series, parallel, or series and parallel electrical interconnection of the super cells in a solar module may also be used.

Figure 3A:
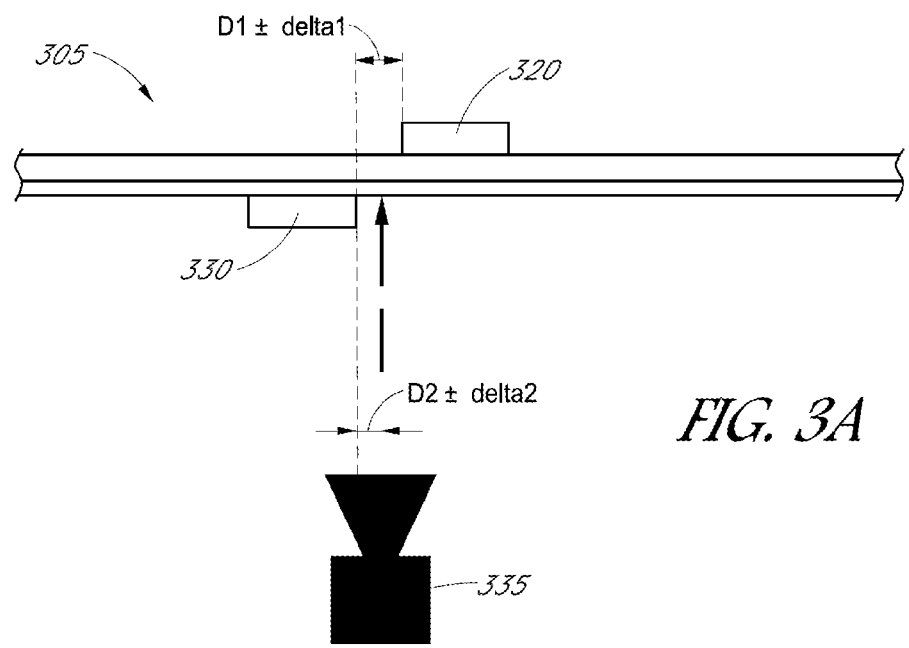
FIGS. 3A-3C show steps in a conventional process for separating a standard size silicon solar cell wafer into smaller silicon solar cells to be arranged in a shingled string of solar cells.
Figure 3B:
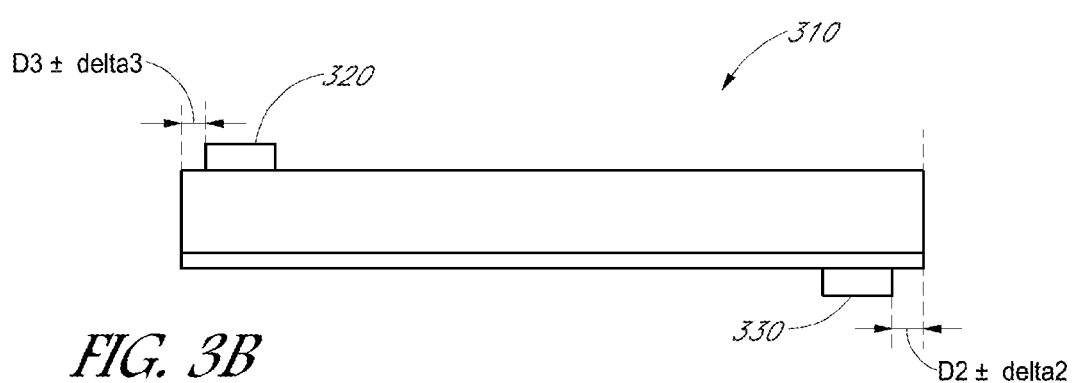
Figure 3C:
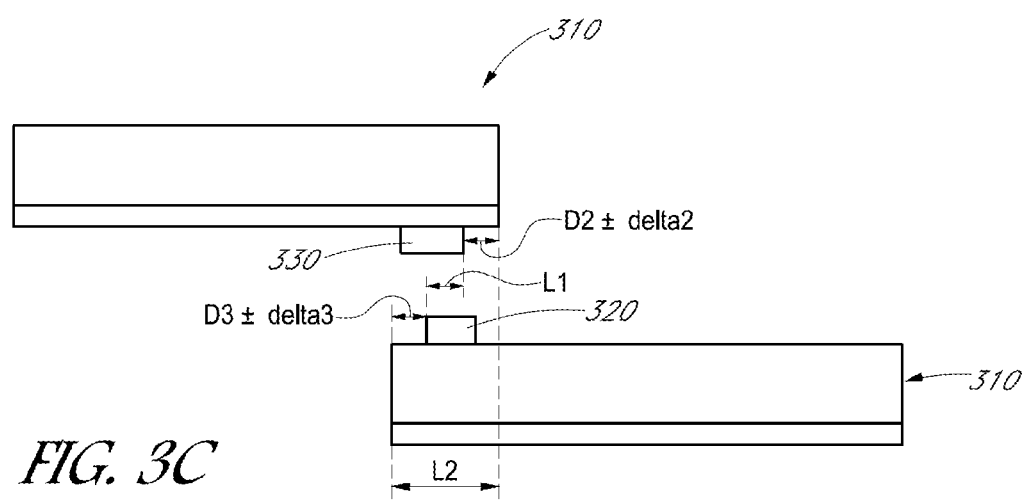

Referring now to FIGS. 3A-3C, in one conventional process for separating a standard size silicon solar cell wafer 305 into smaller silicon solar cells 310 to be arranged in a shingled string of solar cells, the solar cell wafer 305 comprises pairs of front surface bus bars 320 and rear surface bus bars 330 oriented parallel to each other and spaced apart from each other along the plane of the solar cell wafer by a distance D1±delta1. A camera system 335 identifies the location of the edge of rear bus bar 330 nearest to the front surface bus bar, and a laser cuts a scribe line in the rear surface of the solar cell wafer parallel to the rear surface bus bar, between the rear surface bus bar and the front surface bus bar, at a distance D2±delta2 from the edge of the rear surface bus bar identified by the camera system. Two or more such scribe lines are cut in the rear surface of the solar cell wafer by this method (each scribe line between a different pair of front and rear surface bus bars), and then the solar cell wafer is separated (e.g., cleaved) along the scribe lines to form silicon solar cells 310.

As shown in the example of FIG. 3B, each such silicon solar cell 310 comprises a rear surface bus bar 330 oriented parallel to a first cleaved edge of the solar cell and spaced apart from that edge by a distance D2±delta2, and a front surface bus bar 320 oriented parallel to a second cleaved edge of the solar cell, opposite from the first cleaved edge, and spaced apart from the second cleaved edge by a distance D3±delta3 (where D3=D1−D2 and delta3=delta1+delta2). In some variations, D1=0.5 millimeters (mm), D2=0.3 mm, D3=0.2 mm, delta1=0.5 mm, delta2=0.15 mm, and delta3=0.66 mm.

Referring now to FIG. 3C, two such silicon solar cells 310 may be arranged with the front bus bar 320 of one of the solar cells oriented parallel to, overlapped by, and conductively bonded to the rear surface bus bar 330 on another solar cell. This pattern may be continued to build a shingled super cell as shown in FIG. 1, for example. Generally, it is preferred that the front and rear surface bus bars of adjacent solar cells overlap by a minimum distance L1. In some variations, L1=0.5 mm.

The amount by which two adjacent solar cells 310 must overlap to ensure that their bus bars overlap by at least L1 depends on the magnitudes of D1, D2, and their variations. In the worst case, to achieve a minimum bus bar overlap of L1 solar cells prepared by the method just described must overlap by a distance L2=D3+delta3+L1+D2+delta2. The worst case value for L2 may for example be greater than or equal to 1.8 mm for solar cells 310 prepared by the method just described. This value for L2 may be undesirably large, because it reduces exposed active area of the solar cells, and may lead to undesirably narrow process windows (e.g., requirements for high precision) for subsequent steps in assembling a shingled string of such solar cells.

Figure 4A:
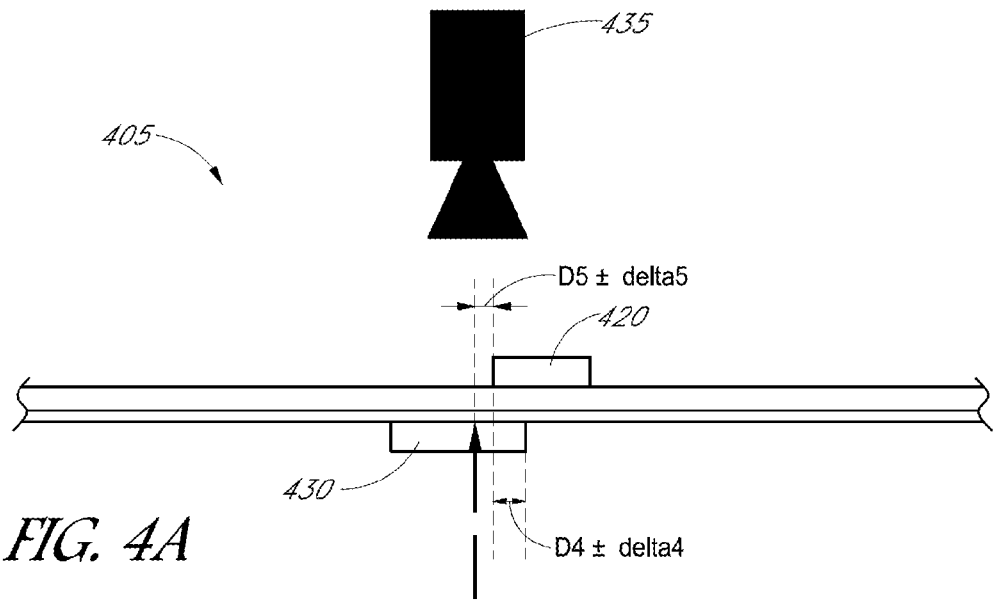
FIGS. 4A-4C show steps in an improved process for separating a standard size silicon solar cell wafer into smaller silicon solar cells to be arranged in a shingled string of solar cells.
Figure 4B:
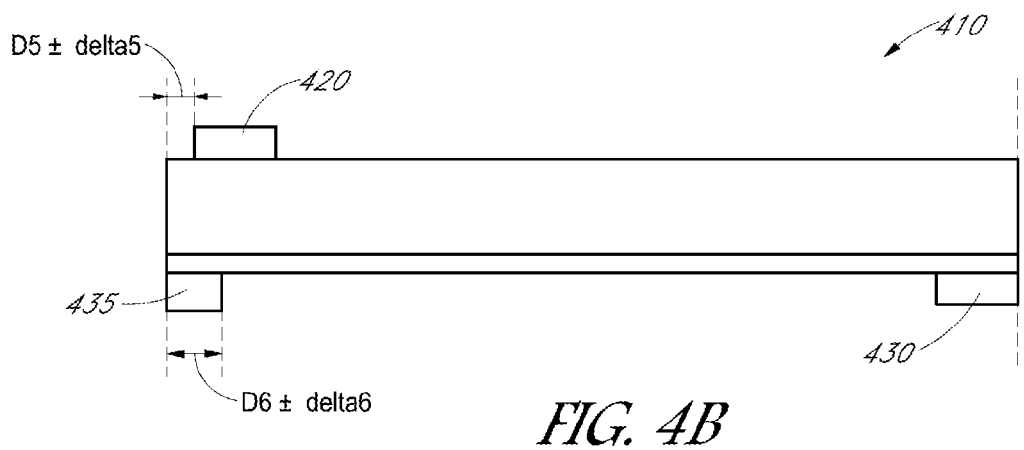
Figure 4C:
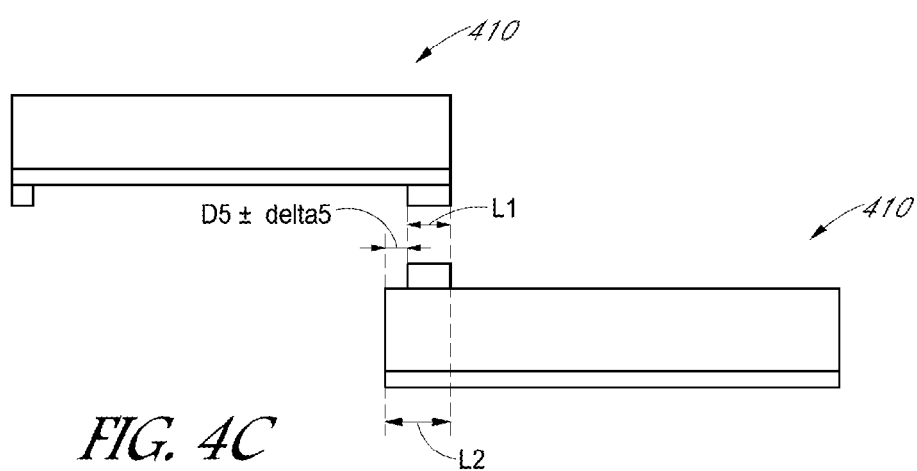

Referring now to FIGS. 4A-4C, in an improved process for separating a standard size silicon solar cell wafer 405 into smaller silicon solar cells 410 to be arranged in a shingled string of solar cells, the solar cell wafer 405 comprises pairs of front surface bus bars 420 and rear surface bus bars 430 oriented parallel to each other with the rear surface bus bar partially underlying the front surface bus bar so that the pair of bus bars overlaps by a distance D4±delta4 in a direction perpendicular to the long axes of the bus bars. A camera system 435 identifies the location of the edge of front bus bar 420 nearest to the rear surface bus bar, and a laser cuts a scribe line in the rear surface of the solar cell wafer through the rear surface bus bar at a distance D5±delta5 from the edge of the front surface bus bar identified by the camera system. Two or more such scribe lines are cut in the rear surface of the solar cell wafer by this method (each scribe line through a different rear surface bus bar), and then the solar cell wafer is separated (e.g., cleaved) along the scribe lines to form silicon solar cells 410.

As shown in the example of FIG. 4B, each such silicon solar cell 410 comprises a rear surface bus bar 430 oriented parallel to and directly abutting a first cleaved edge of the solar cell, and a front surface bus bar 420 oriented parallel to a second cleaved edge of the solar cell, opposite from the first cleaved edge, and spaced apart from the second cleaved edge by the distance D5±delta5. In addition, each silicon solar cell 410 may also comprise a residual bus bar portion 435 cut from the rear surface bus bar ultimately located on another silicon solar cell 410 separated from an adjacent portion of silicon solar cell wafer 405. Residual bus bar portion 435 typically does not form a part of any desired electric circuit, and may optionally be removed from solar cells 410. Residual bus bar portion 435 has a width D6±delta6 (where D6=D4+D5 and delta6=delta4+deltat5). In some variations, D4=0.5 mm, delta4=0.5 mm, D5=0.2 mm, and delta5=0.1 mm. More generally, D5 may for example be about 0.2 mm to about 0.5 mm.

Referring now to FIG. 4C, two such silicon solar cells 410 may be arranged with the front bus bar 420 of one of the solar cells oriented parallel to, overlapped by, and conductively bonded to the rear surface bus bar 430 on another solar cell. This pattern may be continued to build a shingled super cell as shown in FIG. 1, for example. Generally, it is preferred that the front and rear surface bus bars of adjacent solar cells overlap by a minimum distance L1. In some variations, L1=0.5 mm.

In the worst case, to achieve a minimum bus bar overlap of L1 solar cells prepared by the improved method just described must overlap by a distance L2=L1+D5+delta5. The worst case value for L2 may for example be less than or equal to 0.9 mm for solar cells 410 prepared by the improved method just described. This is a significant reduction in required overlap, compared to the method of FIGS. 3A-3C, advantageously increases the amount of exposed active area of the solar cells, and may result in desirably broadened process windows (e.g., reduced precision requirements) for subsequent steps in assembling a shingled string of such solar cells. The improved method just described may also reduce the precision with which the front and rear surface bus bars must be deposited on the standard size solar cell wafer.

Figure 5A:
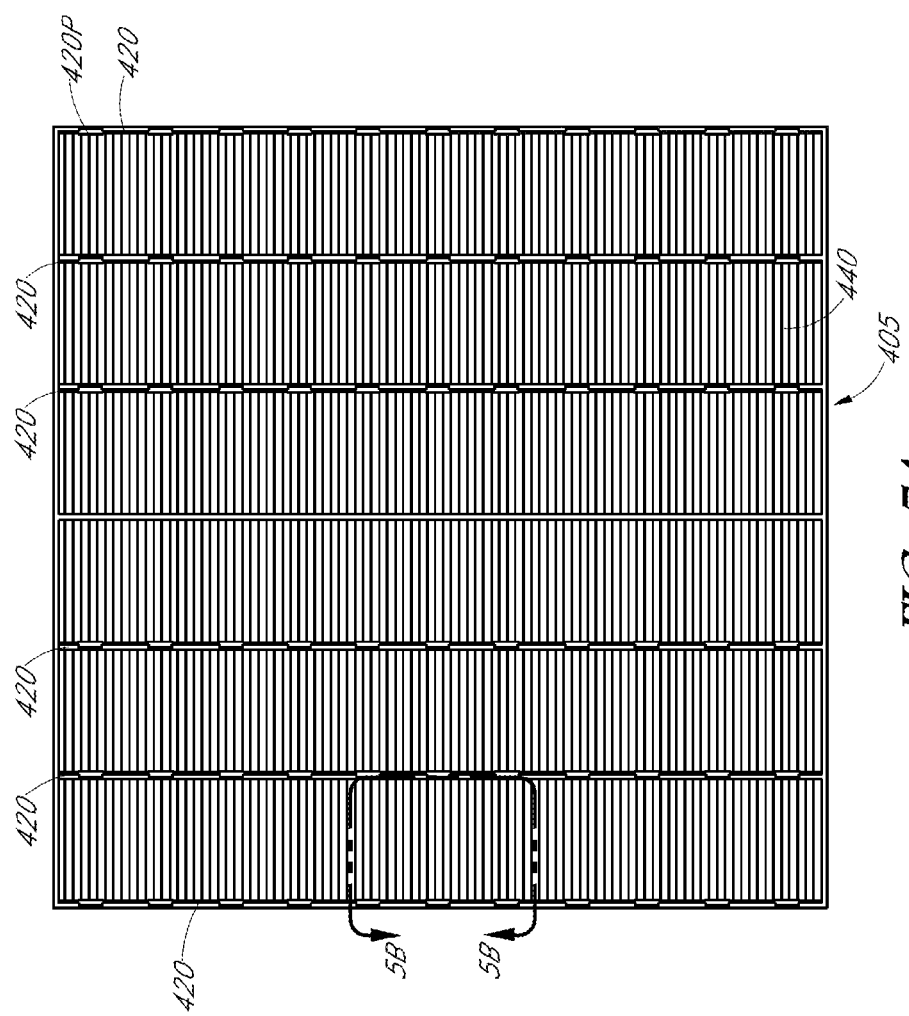
FIGS. 5A-5B show an example front surface metallization pattern for a standard size silicon solar cell suitable for use in the method of FIGS. 4A-4C.
Figure 5B:
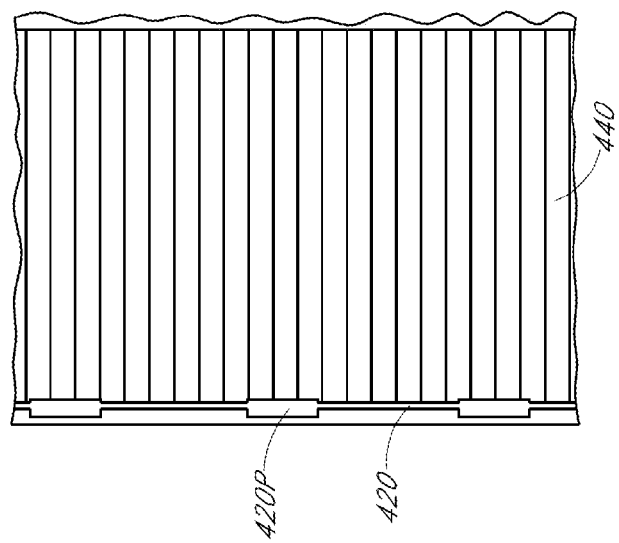

Referring now to FIGS. 5A-5B, an example front surface metallization pattern for a standard sized silicon solar cell suitable for use in the method of FIGS. 4A-4C comprises a plurality of straight front surface bus bars arranged side-by-side with their long axes parallel. The front surface bus bars are spaced apart from each other in a direction perpendicular to their long axes. In the illustrated example each front surface bus bar 420 comprises a plurality of contact pads 420P spaced apart along the axis of the bus bar and interconnected by a conductive line. Any other suitable configuration for a front surface bus bar may also be used. Each bus bar is physically and electrically connected to a corresponding plurality of conductive fingers 440 oriented perpendicularly to the bus bar to form a comb-like conductive structure. Conductive fingers 440 collect current from throughout the front surface of a separated solar cell 410.

Figure 6B:
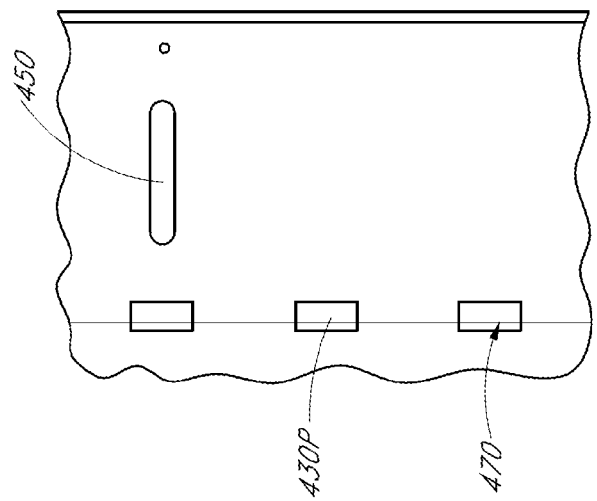
FIGS. 6A-6B show an example rear surface metallization pattern for a standard size silicon solar cell suitable for use with the front surface metallization pattern of FIGS. 5A-5B in the method of FIGS. 4A-4C.
Figure 6A:
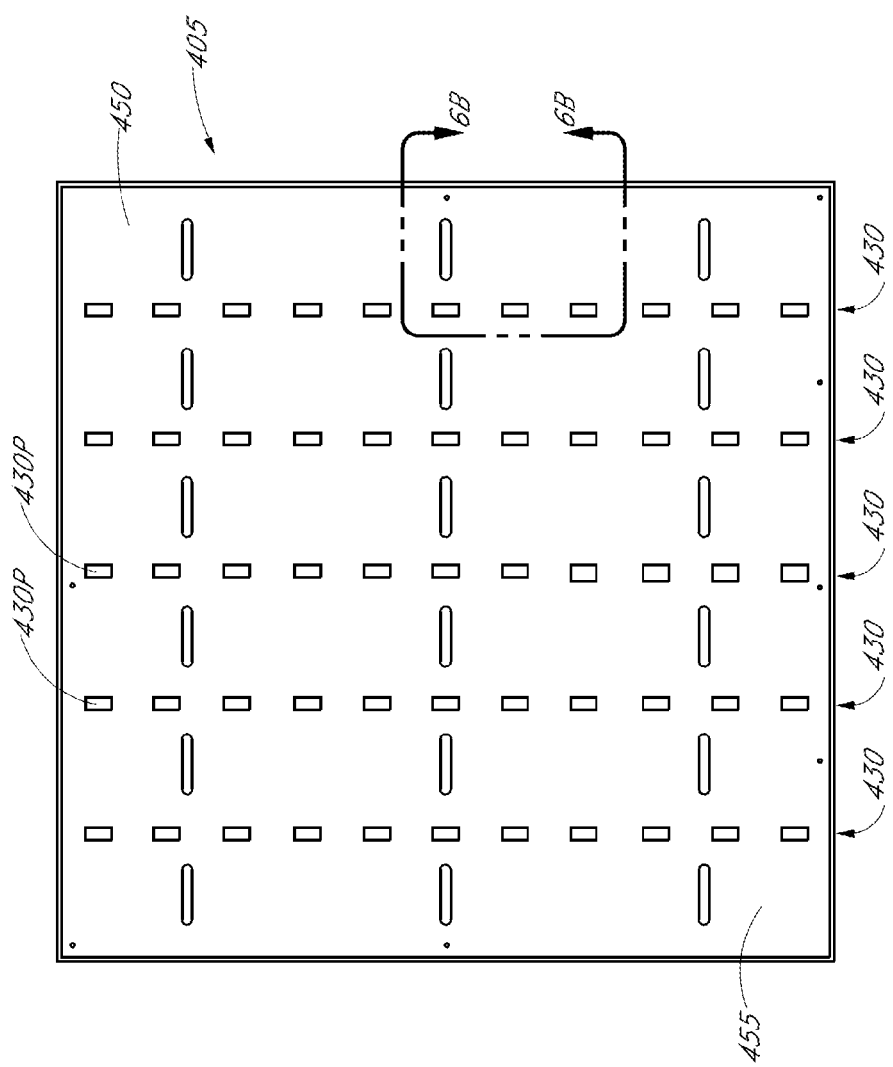

Referring now to FIGS. 6A-6B, an example rear surface metallization pattern suitable for use with the front surface metallization pattern of FIGS. 5A-5B (in the method of FIGS. 4A-4C) comprises a plurality of straight rear surface bus bars 430 arranged side-by-side with their long axes parallel and spaced apart from each other in a direction perpendicular to their long axes. In the illustrated example, rather than being a continuous structure each bus bar 430 is formed as a plurality of discrete contact pads 430P arranged in line and spaced apart along the bus bar axis. Any other suitable configuration for a rear surface bus bar may also be used. The example rear surface metallization pattern of FIGS. 6A-6B also comprises contact pads 450 and a rear surface contact 455. In an assembled solar module, contact pads 450 may, for example, be bonded to conductive leads (e.g., leads 15 or 17 described above) used to form bypass diode circuits or to draw power from the solar cells. Rear surface bus bars 430 and contact pads 450 are physically and electrically connected to rear surface contact 455, which collects current from throughout the rear surface of a separated solar cell 410.

FIG. 6B also indicates with (imaginary) line 470 where a scribe line may be cut in the rear surface metallization through a bus bar 430, as described above with respect to FIGS. 4A-4C.

Front surface bus bar contact pads 420P (FIGS. 5A-5B) and rear surface bus bar contact pads 430P (FIGS. 6A-6C) are dimensioned and positioned so that when separated solar cells 410 are positioned in an overlapping manner as shown in FIG. 4C, corresponding front surface and rear surface contact pads on the overlapping solar cells may be aligned along the direction of the bus bar axes as well as along the direction of solar cell overlap.

Referring again to FIG. 6A, the central bus bar 430 in this example rear surface metallization pattern (comprising contact pads 430P that are wider than those in the other rear surface bus bars) does not underlie any front surface bus bar. Each of the other rear surface bus bars 430 partially underlies a corresponding front surface bus bar. Referring again to FIG. 5A, the two front surface bus bars 420 located along opposite edges of the standard size solar cell do not overlie any rear surface bus bar. Each of the other front surface bus bars 420 partially overlies a corresponding rear surface bus bar.

Figure 7B:
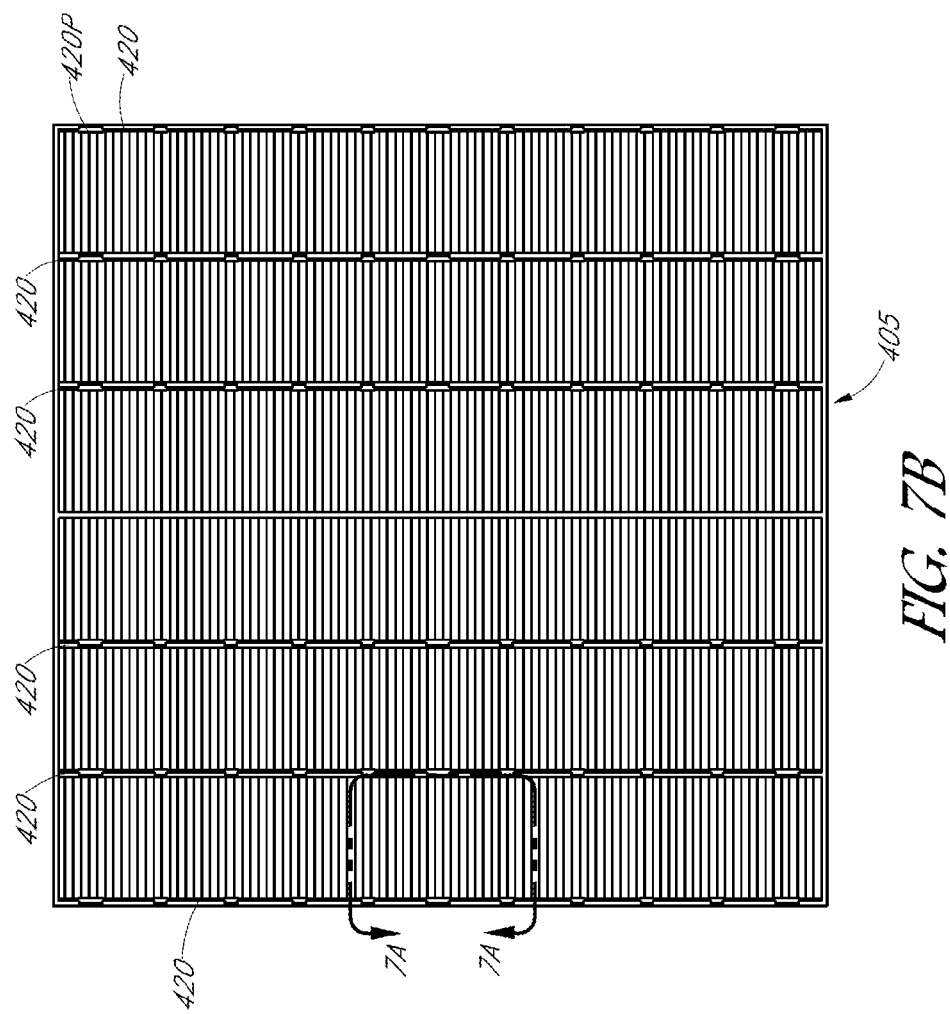
FIGS. 7A-7B show another example front surface metallization pattern for a standard size silicon solar cell suitable for use in the method of FIGS. 4A-4C.
Figure 7A:
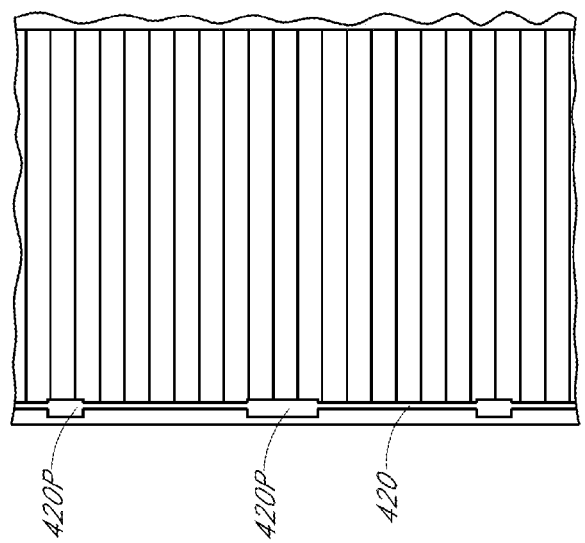

FIGS. 7A-7B show another example front surface metallization pattern for a standard sized silicon solar cell suitable for use in the method of FIGS. 4A-4C, differing from that of FIGS. 5A-5B primarily in that contact pads 420P vary in size along the front surface bus bar. In the illustrated example, each front surface bus bar comprises three contact pads 420P of a first size, one at each end and one in the middle, and additional contact pads of a second smaller size evenly spaced along the bus bar between the larger contact pads.

FIGS. 8A-8B show an example rear surface metallization pattern suitable for use with the front surface metallization pattern of FIGS. 7A-7B in the method of FIGS. 4A-4C, differing from that of FIGS. 6A-6B primarily in that contact pads 430P vary in size in a manner similar to and corresponding to that of contact pads 420P in FIGS. 7A-7B.

Figure 9:
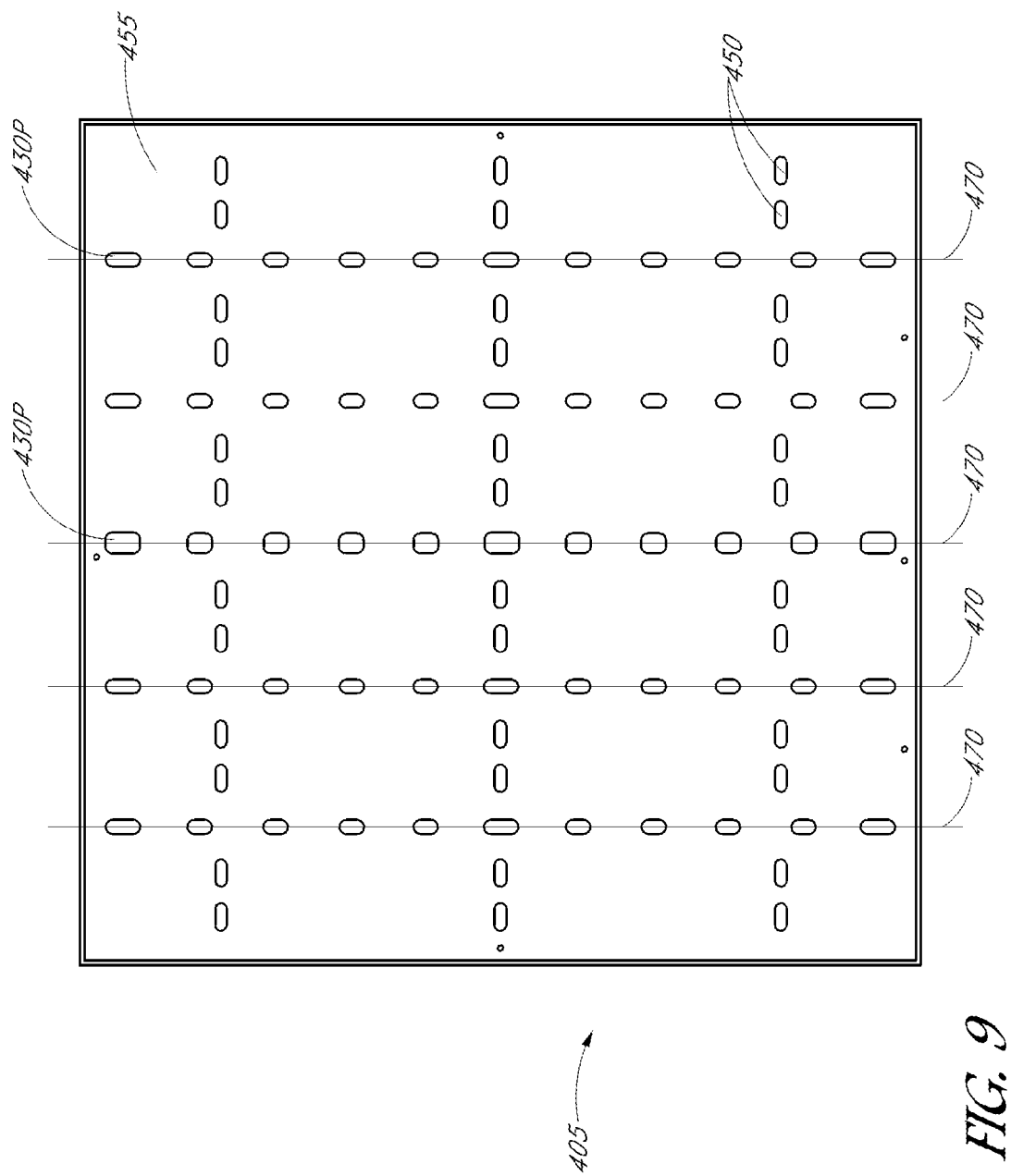
FIG. 9 shows the locations at which scribe lines are to be cut on the example rear surface metallization pattern of FIGS. 8A-8B.

In FIG. 9, imaginary lines 470 indicate where scribe lines may be cut through rear surface bus bars 430 in the example rear surface metallization pattern of FIG. 8B, as described above with respect to FIGS. 4A-4C.

Figure 10A:
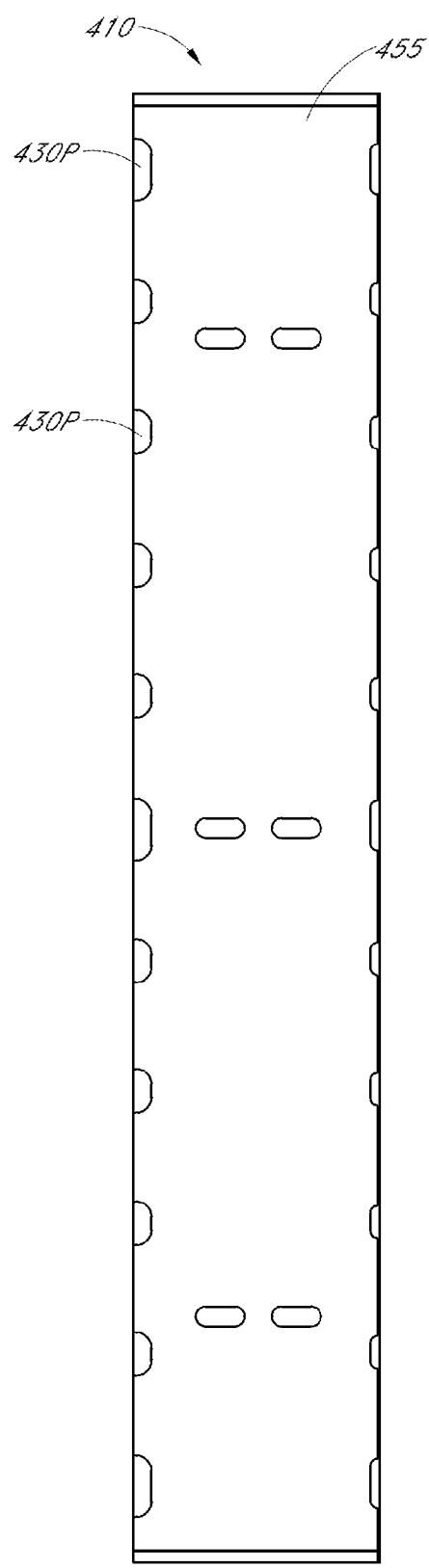
FIG. 10A and FIG. 10B show, respectively, front and rear surface metallization patterns on a separated solar cell prepared by the method of FIGS. 4A-4C using the front and rear surface metallization patterns of FIGS. 7A-7B and FIGS. 8A-8B.
Figure 10B:
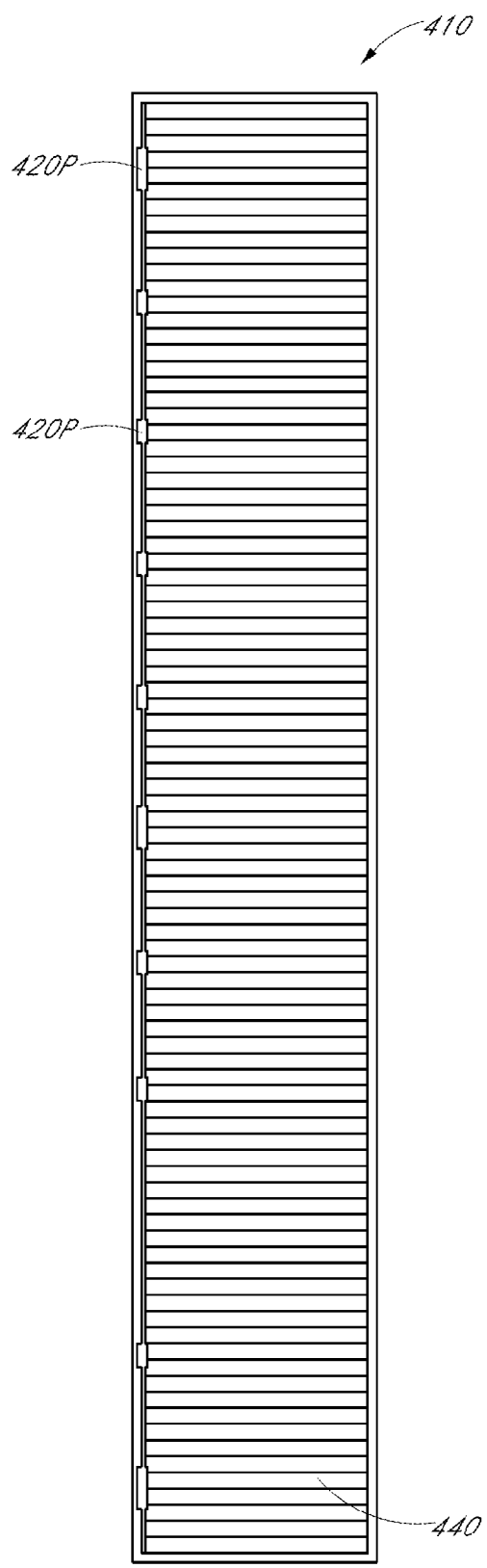

FIG. 10A shows the front surface metallization pattern on a solar cell 410 prepared by the method of FIGS. 4A-4C using the front and rear surface metallization patterns of FIGS. 7A-7B and FIGS. 8A-8B. FIG. 10B shows the rear surface metallization patterns on the solar cell.

A front surface metallization pattern suitable for use in the method of FIGS. 4A-4C may comprise fiducial markers located at predetermined and known locations in the metallization pattern. The camera system used in the method may use the fiducials as reference points by which to precisely identify the locations of other features in the metallization pattern such as front surface bus bars, for example. In the front surface metallization pattern depicted in FIGS. 11A-11B, for example, the fiducials are cross patterns 480 formed by a thin metallization line running perpendicular to and crossing a finger in the metallization pattern. The thin metallization line may have a width of, for example, about 40 microns and may be similar or identical in width to the fingers it crosses. Alternatively, the fiducials may be, for example, filled circles (for example, 600 micron diameter circles) or of any other suitable shape and size. The fiducials may be formed from the same material (for example, silver) as the fingers. The fiducials may be located, for example, at positions 485 around the perimeter of the front surface of the solar cell.

The bus bars, conductive fingers, and contact pads described above may be formed, for example, from silver. Rear surface contact 455 may be formed, for example, from aluminum. Any other suitable materials may also be used for these structures.

Referring to the methods and solar cells described with respect to FIGS. 4A-9, front surface bus bars (e.g., contact pad portions of such bus bars) on standard size silicon solar cell wafers may have design widths perpendicular to their long axes of, for example, about 1 mm to about 1.5 mm with manufacturing tolerance of ±0.1 mm, resulting in real widths of, for example, about 0.9 mm to about 1.6 mm. Rear surface bus bars (e.g., contact pad portions of such bus bars) may have design widths perpendicular to their long axes of, for example, about 1.5 mm to about 3.0 mm with manufacturing tolerance of about ±0.1 mm, resulting in real widths of, for example, about 1.4 mm to about 3.1 mm.

In instances where a front surface bus bar partially overlies a corresponding rear surface bus bar on a standard sized silicon solar cell wafer, as per the method described with respect to FIGS. 4A-4C, the front and rear surface bus bars may overlap in a direction perpendicular to their long axes by for example about 0 mm to about 1 mm, where at 0 mm overlap the front and rear surface bus bars would be abutting if on the same surface.

In the method described above with respect to FIGS. 4A-4C, each scribe line may be spaced apart from an edge of its corresponding front surface bus bar by a predetermined distance of for example about 0.1 mm to about 0.6 mm.

Shingled solar modules as described herein may be constructed as follows, for example. As described above, standard size square or pseudo square solar cells are diced to separate each standard solar cell into two or more rectangular or substantially rectangular solar cells. The rectangular or substantially rectangular solar cells are then arranged in an overlapping manner and conductively bonded to each other to form super cells.

In a subsequent lay-up step, the super cells are arranged sunny side down on a transparent front sheet (e.g., a glass sheet) in the physical configuration desired for the module. An encapsulant layer or sheet may optionally be positioned between the super cells and the transparent front sheet. All leads, interconnects, and other conductors, if intended to be present in the laminate structure of the finished solar module, are then arranged in the desired physical configuration with respect to the super cells.

After the super cells and the other module components are arranged in the desired physical configuration, a backing sheet is positioned on top of the arranged components. An encapsulant layer or sheet may optionally be positioned between the backing sheet and the super cells. The resulting structure is subjected to heat and pressure to form a laminate.

Any other method of constructing the solar modules described herein may also be used.

This disclosure is illustrative and not limiting. Further modifications will be apparent to one skilled in the art in light of this disclosure and are intended to fall within the scope of the appended claims. For example, where methods and steps described above indicate certain events occurring in certain order, those of ordinary skill in the art will recognize that the ordering of certain steps may be modified, and that some steps may be omitted or additional steps added, and that such modifications are in accordance with the variations of the invention

What is claimed is:

1. A solar cell comprising:
a silicon semiconductor diode structure having a front surface to be illuminated by light and a back surface;
a front surface metallization pattern comprising a plurality of straight front surface bus bars each having a long axis, the front surface bus bars arranged side-by-side with their long axes parallel and spaced apart from each other in a direction perpendicular to their long axes;
a rear surface metallization pattern comprising a plurality of straight rear surface bus bars each having a long axis, the rear surface bus bars arranged side-by-side with their long axes parallel and spaced apart from each other in a direction perpendicular to their long axes, and
a plurality of scribe lines cut into the back surface of the solar cell, each scribe line cut through a corresponding one of the rear surface bus bars parallel to the long axis of the rear surface bus bar into the silicon semiconductor diode structure;
wherein the long axes of the rear surface bus bars are oriented parallel to the long axes of the front surface bus bars, and each front surface bus bar partially, but not entirely, overlies a corresponding rear surface bus bar to overlap the corresponding rear surface bus bar in a direction perpendicular to the long axes of the front and rear surface bus bars.

2. The solar cell of claim 1, wherein the front and rear surfaces are square or pseudo-square in shape, the long axes of the front and rear surface bus bars are oriented parallel to an edge of the solar cell, and the front and rear surface bus bars extend for substantially the full length of the edge of the solar cell.

3. The solar cell of claim 1, wherein each front surface bus bar partially overlies a corresponding rear surface bus bar to overlap the corresponding rear surface bus bar in a direction perpendicular to the long axes of the front and rear surface bus bars by less than or equal to about 1 mm.

4. The solar cell of claim 1, comprising one or more additional front surface bus bars each having a long axis oriented parallel to the long axes of the plurality of front surface bus bars, the one or more additional front surface bus bars arranged side-by-side with the plurality of front surface bus bars and spaced apart from each other and from the plurality of front surface bus bars in a direction perpendicular to their long axes, the one or more additional front surface bus bars not overlying any rear surface bus bar.

5. The solar cell of claim 1, comprising one or more additional rear surface bus bars each having a long axis oriented parallel to the long axes of the plurality of rear surface bus bars, the one or more additional rear surface bus bars arranged side-by-side with the plurality of rear surface bus bars and spaced apart from each other and from the plurality of rear surface bus bars in a direction perpendicular to their long axes, the one or more additional rear surface bus bars not underlying any front surface bus bar.

6. The solar cell of claim 1, wherein each of the plurality of front surface bus bars has a width perpendicular to its long axis of about 0.9 mm to about 1.6 mm.

7. The solar cell of claim 1, wherein each of the plurality of rear surface bus bars has a width perpendicular to its long axis of about 1.4 mm to about 3.1 mm.

8. The solar cell of claim 1, wherein:
the front surface metallization pattern comprises fingers running perpendicular to the bus bars and a plurality of fiducials arranged in an outer periphery of the front surface metallization; and
each fiducial comprises a thin metallization line running perpendicular to and crossing a finger.

9. The solar cell of claim 1, wherein each scribe line is spaced apart from an edge of a corresponding front surface bus bar by a distance of about 0.1 mm to about 0.6 mm.

10. A method of making a shingled string of solar cells, the method comprising:
obtaining a solar cell comprising:
a silicon semiconductor diode structure having a front surface to be illuminated by light and a back surface;
a front surface metallization pattern comprising a plurality of straight front surface bus bars each having a long axis, the front surface bus bars arranged side-by-side with their long axes parallel and spaced apart from each other in a direction perpendicular to their long axes; and
a rear surface metallization pattern comprising a plurality of straight rear surface bus bars each having a long axis, the rear surface bus bars arranged side-by-side with their long axes parallel and spaced apart from each other in a direction perpendicular to their long axes,
wherein the long axes of the rear surface bus bars are oriented parallel to the long axes of the front surface bus bars, and each front surface bus bar partially overlies a corresponding rear surface bus bar to overlap the corresponding rear surface bus bar in a direction perpendicular to the long axes of the front and rear surface bus bars;
identifying the location of each of the front surface bus bars with a camera; and
cutting a plurality of scribe lines in the solar cell on the rear of the solar cell, each scribe line cut parallel to and through a corresponding rear surface bus bar into the silicon semiconductor structure at a location referenced to the location determined with the camera of the front surface bus bar partially overlying the rear surface bus bar, the scribe line spaced apart from an edge of the front surface bus bar by a predetermined distance.

11. The method of claim 10, wherein each scribe line is spaced apart from an edge of its corresponding front surface bus bar by a predetermined distance of about 0.1 mm to about 0.6 mm.

12. The method of claim 10, comprising:
separating the solar cell along the scribe lines to form a plurality of smaller solar cells, each smaller solar cell comprising a front surface bus bar on its front surface positioned along a first edge of the smaller solar cell and a rear surface bus bar on its rear surface positioned along a second edge of the smaller solar cell opposite from its first edge; and
arranging the plurality of smaller solar cells in line with front and rear surface bus bars of adjacent smaller solar cells overlapping in a shingled manner and conductively bonded to each other to electrically and mechanically connect the smaller solar cells in series.

13. The method of claim 12, wherein sides of adjacent smaller solar cells overlap by about 0.5 mm to about 1.5 mm.

14. The method of claim 10, wherein each of the plurality of front surface bus bars on the solar cell has a width perpendicular to its long axis of about 0.9 mm to about 1.6 mm.

15. The method of claim 10, wherein each of the plurality of rear surface bus bars on the solar cell has a width perpendicular to its long axis of about 1.4 mm to about 3.1 mm.

16. The method of claim 10, wherein each front surface bus bar on the solar cell partially overlies a corresponding rear surface bus bar to overlap the corresponding rear surface bus bar in a direction perpendicular to the long axes of the front and rear surface bus bars by about 0 mm to about 1 mm.

17. The method of claim 10, wherein:
the front surface metallization pattern comprises fingers running perpendicular to the bus bars and a plurality of fiducials arranged in an outer periphery of the front surface metallization, and each fiducial comprises a thin metallization line running perpendicular to and crossing a finger; and
identifying the location of each of the front surface bus bars with a camera comprises identifying the locations of the fiducials with the camera.

* * * * *

UNITED STATES PATENT AND TRADEMARK OFFICE
CERTIFICATE OF CORRECTION

PATENT NO. : 10,510,907 B2
APPLICATION NO. : 15/441117
DATED : December 17, 2019
INVENTOR(S) : Yafu Lin and Benjamin Francois Page 1 of 1

It is certified that error appears in the above-identified patent and that said Letters Patent is hereby corrected as shown below:

In the Specification

After Column 1, Line 10, insert the following text:
--STATEMENT REGARDING FEDERALLY SPONSORED RESEARCH OR DEVELOPMENT
This invention was made with government support under DE-EE0007190 awarded by The U.S. Department of Energy. The government has certain rights in the invention.--

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*